(12) United States Patent
Fantini et al.

(10) Patent No.: US 9,852,794 B2
(45) Date of Patent: *Dec. 26, 2017

(54) SYSTEMS, METHODS AND DEVICES FOR PROGRAMMING A MULTILEVEL RESISTIVE MEMORY CELL (71) Applicant: Micron Technology, Inc., Boise, ID (US)

(72) Inventors: Paolo Fantini, Vimercate (IT); Massimo Ferro, Camisano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/354,822

(22) Filed: Nov. 17, 2016

(65) Prior Publication Data

US 2017/0069381 A1 Mar. 9, 2017

Related U.S. Application Data

(63) Continuation of application No. 14/936,186, filed on Nov. 9, 2015, now Pat. No. 9,530,497, which is a continuation of application No. 13/597,639, filed on Aug. 29, 2012, now Pat. No. 9,183,929.

(51) Int. Cl.
*G11C 13/00* (2006.01)
*G11C 11/56* (2006.01)

(52) U.S. Cl.
CPC .......... *G11C 13/0069* (2013.01); *G11C 11/56* (2013.01); *G11C 11/5678* (2013.01); *G11C 13/0004* (2013.01); *G11C 13/0097* (2013.01); *G11C 13/0002* (2013.01); *G11C 2013/0073* (2013.01); *G11C 2013/0092* (2013.01); *G11C 2213/15* (2013.01)

(58) Field of Classification Search
CPC . G11C 11/56; G11C 11/5678; G11C 13/0004; G11C 13/0069; G11C 13/0097
USPC .............. 365/148, 158, 163, 185.03, 185.11
See application file for complete search history.

(56) References Cited

U.S. PATENT DOCUMENTS

| | | |
|---|---|---|
| 5,751,637 A | 5/1998 | Chen et al. |
| 6,888,745 B2 | 5/2005 | Ehiro et al. |
| 7,151,701 B2 | 12/2006 | Combe et al. |
| 7,391,642 B2 | 6/2008 | Gordon et al. |
| 7,440,315 B2 | 10/2008 | Lung |
| 7,515,460 B2 | 4/2009 | Gordon et al. |
| 7,522,449 B2 | 4/2009 | Ro et al. |
| 7,593,255 B2 | 9/2009 | Happ et al. |
| 7,679,980 B2 | 3/2010 | Happ et al. |
| 7,719,874 B2 | 5/2010 | Scheuerlein et al. |
| 7,787,291 B2 | 8/2010 | Resta et al. |
| 7,800,934 B2 | 9/2010 | Kumar et al. |
| 7,885,101 B2 | 2/2011 | Bedeschi et al. |
| 7,894,237 B2 | 2/2011 | Karpov et al. |
| 7,898,847 B2 | 3/2011 | Philipp |
| 7,929,336 B2 | 4/2011 | Philipp et al. |

(Continued)

FOREIGN PATENT DOCUMENTS

KR 20090097726 9/2009

*Primary Examiner* — Tan T. Nguyen
(74) *Attorney, Agent, or Firm* — Holland & Hart LLP (57) ABSTRACT

Embodiments disclosed herein may relate to programming a multi-level memory cell with programming pulse sequences that comprise forward-biased and reverse-biased programming pulses.

20 Claims, 10 Drawing Sheets

(56) References Cited

U.S. PATENT DOCUMENTS

| | | |
|---|---|---|
| 7,944,740 B2 | 5/2011 | Lam et al. |
| 7,952,919 B2 | 5/2011 | Liu et al. |
| 8,000,127 B2 | 8/2011 | Hamilton et al. |
| 8,036,014 B2 | 10/2011 | Lee et al. |
| 8,144,525 B2 | 3/2012 | Macerola et al. |
| 8,149,608 B2 | 4/2012 | Lee |
| 8,149,616 B2 | 4/2012 | Bedeschi et al. |
| 8,149,625 B2 | 4/2012 | Hwang |
| 8,259,490 B2 | 9/2012 | Kang et al. |
| 8,305,812 B2 | 11/2012 | Levy et al. |
| 8,351,251 B2 | 1/2013 | Eleftheriou et al. |
| 8,441,847 B2 | 5/2013 | Eleftheriou et al. |
| 8,446,758 B2 | 5/2013 | Chen |
| 8,456,913 B2 | 6/2013 | An |
| 8,542,520 B2 | 9/2013 | Hirose |
| 8,730,708 B2 | 5/2014 | Chen |
| 8,958,233 B2 | 2/2015 | Chen |
| 9,117,519 B2 | 8/2015 | Spessot et al. |
| 9,218,876 B2 | 12/2015 | Spessot et al. |
| 9,530,497 B2 * | 12/2016 | Fantini .................... G11C 11/56 |
| 2010/0284212 A1 * | 11/2010 | Bedeschi ............ G11C 11/5678 365/163 |

* cited by examiner

120
SYSTEMS, METHODS AND DEVICES FOR PROGRAMMING A MULTILEVEL RESISTIVE MEMORY CELL

CROSS-REFERENCE TO RELATED APPLICATIONS

The present application for patent is a continuation application of U.S. patent application Ser. No. 14/936,186 by Fantini et al. entitled "Systems, Methods and Devices for Programming a Multilevel Resistive Memory Cell," filed Nov. 9, 2015, which is a continuation application of U.S. patent application Ser. No. 13/597,639 by Fantini et al., entitled "Systems, Methods and Devices for Programming a Multilevel Resistive Memory Cell," filed Aug. 29, 2012, assigned to the assignee hereof, and each of which is expressly incorporated by reference in its entirety herein.

FIELD

Subject matter disclosed herein may relate to integrated circuit devices, and may relate, more particularly, to circuitry associated with memory.

BACKGROUND

Integrated circuit devices, such as memory devices, for example, may be found in a wide range of electronic devices. For example, memory devices may be used in computers, digital cameras, cellular telephones, personal digital assistants, etc. Factors related to a memory device that may be of interest to a system designer in considering suitability for a particular application may include, physical size, storage density, operating voltages, granularity of read/write operations, throughput, transmission rate, and/or power consumption, for example. Other example factors that may be of interest to system designers may include cost of manufacture, ease of manufacture, and/or reliability.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from the scope of claimed subject matter. It should also be noted that directions and/or references, for example, up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

Integrated circuit devices, such as non-volatile memory devices, may be found in a wide range of electronic devices. Non-volatile memory devices may be used in computers, digital cameras, cellular telephones, and/or personal digital assistants, to name but a few examples. Factors related to a memory device that may be of interest in considering suitability for a particular application may include physical size, storage density, operating voltages, granularity of read/write operations, throughput, transmission rate, and/or power consumption. Other example factors that may be of interest may include cost of manufacture, and/or ease of manufacture. One example aspect of memory array design that may affect one or more factors may include integrated circuit die size. One or more process technologies utilized to manufacture a memory device may at least in part affect some of the factors, such as those mentioned above, including storage density, physical size, cost/ease of manufacture, and/or reliability for example. In an embodiment, multi-level programming (MLP) capabilities for one or more cells in a memory may be utilized to increase storage density, for example. As used herein, "multi-level programming" may refer to one or more cells of a memory device capable of being programmed to any of more than two states (referred to hereinafter as "programmed states"). For example, a single-level phase change memory (PCM) cell may be programmed to a "set" state or a "reset" state. A multi-level PCM cell may be programmed to one or more intermediate states between a set state and/or a reset state, in an embodiment, for example.

Figure 1:
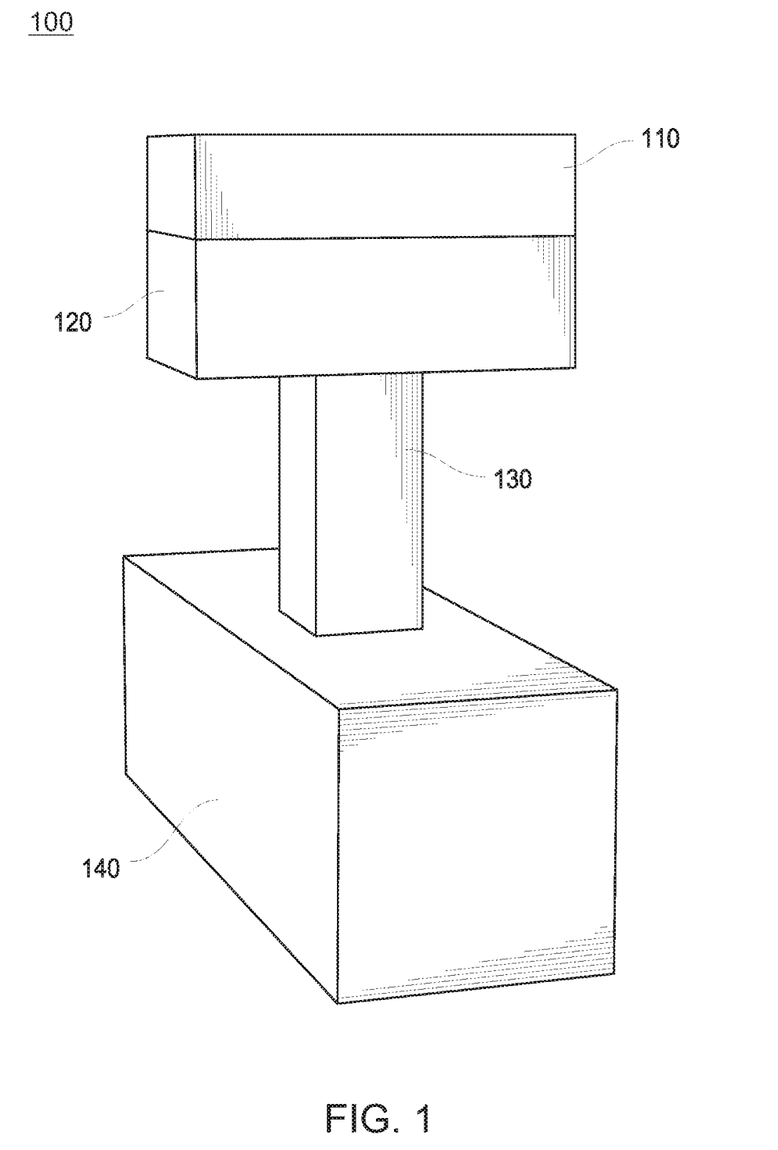
FIG. 1 is an illustration depicting an isometric view of an example apparatus including a phase change memory (PCM) cell according to an embodiment.

FIG. 1 is an illustration depicting an isometric view of an example apparatus 100 that may include a storage component 120 comprising a phase change material, according to an embodiment. Apparatus 100 may comprise storage component 120, a "top" electrode 110, and a "bottom" electrode contact 130. It should be noted that directions and/or references, for example, such as up, down, top, bottom, and so on, may be used to facilitate discussion of drawings and/or are not intended to restrict application of claimed subject matter. However, it is noted that for the embodiment illustrated, current may flow from bottom electrode contact 130 to top electrode 110 or from top electrode 110 to bottom electrode contact 130 during programming of the cell, for example. In an embodiment, current may flow in one direction for a period of time, and may flow in an opposite direction for a subsequent period of time in some situations. As used herein, "forward bias" may refer to a voltage and/or current pulse, or sequence of pulses, applied across storage component 120 such that current may flow from top electrode 110 to bottom electrode contact 130, in an embodiment. Also, as used herein, "reverse bias" may refer to a voltage and/or current pulse, or sequence of pulses, applied across storage component 120 such that current may flow from bottom electrode contact 130 to top electrode 110, in an embodiment, although claimed subject matter is not limited in these respects.

A portion of an electrically conductive bottom electrode 140 is also depicted in FIG. 1. In an embodiment, an electrically conductive component, such as bottom electrode 140, may comprise a sufficiently electrically conductive material, such as doped silicon, polysilicon, carbon, and/or metallic material, such as tungsten, titanium nitride, and/or titanium aluminum nitride, for example, for use in a memory device. Of course, claimed subject matter is not limited in scope in these respects. Other materials may, of course, also be used in an embodiment. Also in an embodiment, top electrode 110 may comprise a sufficiently electrically conductive material, such as polysilicon, carbon, and/or metallic material, such as tungsten, titanium nitride, and/or titanium aluminum nitride, for example, for use in a memory device, although again claimed subject matter is not limited in scope in these respects.

In an embodiment, storage component 120 may comprise a resistive memory material, such as a chalcogenide material. A storage component, such as 120, may comprise a memory material capable of storing one or more of at least two different selectable states to thereby operate as a memory. For example, in a binary system, states may be considered a binary "0" or a binary "1." In an embodiment, a "set" state, representing a binary value of '1,' for example, may correspond to a more crystalline, more conductive state for memory material of a storage component, such as 120. Also, in an embodiment, a "reset" state, representing a binary value of '0,' for example, may correspond to a more amorphous, more resistive state of a memory material for a storage component, such as 120. Of course, assignment of states to particular binary values may be different than the example above. Furthermore, in other systems, an individual memory cells may have a configuration in which the number of selectable states may be more than two. For example, a storage component may be programmable to any of three selectable states, in an embodiment. In an additional embodiment, a storage component may be programmable to any of four selectable states. Of course, claimed subject matter is not limited in scope in these respects. Embodiments discussed herein may implement three or more selectable states, as described more fully below.

For a storage component comprising a phase change material, heat of a sufficient amount may be employed to change state of the phase change material. A change of state may be achieved by generating a current and/or voltage pulse to be utilized with an electrode, such as bottom electrode 140 and bottom electrode contact 130 and/or top electrode 110, in a manner to affect a proximate phase change material storage component, such as 120, in an embodiment. Also, in an embodiment, a voltage pulse may be applied in what may be referred to as a forward bias, with top electrode 110 at a potential greater in magnitude than bottom electrode 140. For a forward bias example, a positive voltage potential may be applied to top electrode 110, and bottom electrode 140 may be coupled to a ground potential, in an embodiment. For a reverse bias example, a positive voltage potential may be applied to bottom electrode 140, and top electrode 110 may be coupled to a ground potential. Of course, these are merely example configurations, and the scope of claimed subject matter is not limited in these respects. Additionally, the memory cell illustrated in FIG. 1 is merely an example, and again, claimed subject matter is not limited in scope in this respect. Also, although example embodiments described herein utilize storage components comprising phase change memory material, other embodiments may utilize other previously existing or future resistive memory technologies. Therefore, claimed subject matter is not limited in scope in this respect.

In an embodiment, a programmed state of a PCM storage component, such as 120, may depend, at least in part, on one or more characteristics of one or more programming pulses and/or sequences of programming pulses applied across a PCM storage component, such as 120. Example characteristics of one or more programming pulses may include, for example, an amount of pulses, magnitudes of individual pulses, pulse sequence configuration, and/or whether pulses are applied with a forward bias or with a reverse bias. In an embodiment, reverse bias programming pulses may be utilized to produce one or more intermediate programming states between a set state and a reset state, for example. One or more intermediate programming states may be implemented, for example, based at least in part on different thermal behaviors within a storage component, such as PCM storage component 120, depending on whether a forward-biased programming pulse or a reverse-biased programming pulse is applied to the storage component. Differences in storage component thermal behavior depending on programming pulse bias may be due, at least in part, to electro-migration of atoms of materials within a storage component. For example, a storage component, such as PCM storage component 120, may comprise antimony and/or germanium atoms that may migrate from a bottom portion of a storage component to a top portion of a storage component under reverse-bias programming pulse conditions. Antimony and/or germanium atoms may migrate towards a bottom portion of a storage component under forward-bias programming pulse conditions, in an example embodiment. Of course, claimed subject matter is not limited in scope in these respects. Different thermal behavior of a storage component depending on programming pulse bias may affect programming of the storage component, in that different resistance levels may be achieved depending on programming pulse bias, in an embodiment. Differences in resistance values for programmed storage components depending on programming pulse bias may allow a memory device to program a storage component to one or more intermediate programming states between a set state and a reset state, as described more fully below.

Figure 2:
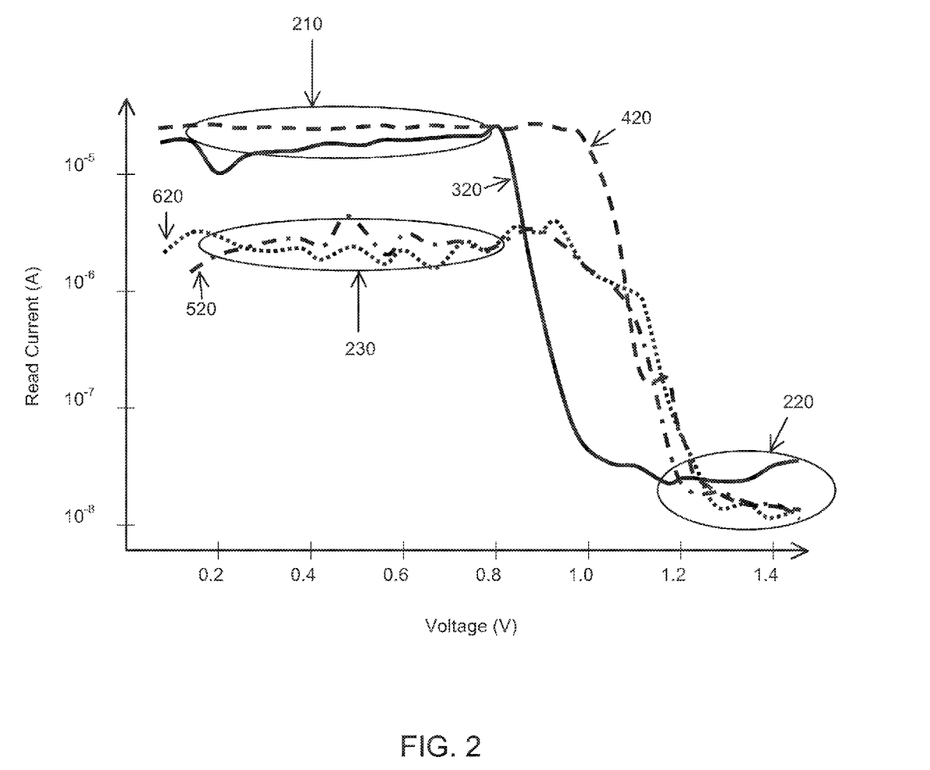
FIG. 2 is an illustration depicting example read current/voltage curves for an example multi-level resistive storage component programmed with example programming voltage and/or current pulse sequences, according to an embodiment.

FIG. 2 is an illustration depicting example read current/voltage curves for an example multi-level resistive storage component programmed with example programming voltage and/or current pulse sequences, according to an embodiment. For the example chart of FIG. 2, a plurality of example read current/programming voltage curves corresponding to a plurality of example programming pulse sequences for an example multi-level resistive storage component, such as storage component 120, are depicted. For the example chart of FIG. 2, example curves 320, 420, 520, and 620 may depict example read-out currents ("y" axis) for a given readout bias as a function of example programming pulse magnitudes ("x" axis) for example programming pulse sequences, described more fully below in connection with FIGS. 3-6. FIG. 2 further depicts a "set" state 210 indicative of a first programming state, a "reset" state 220 indicative of a second programming state, and an intermediate state 230 indicative of a third programming state, for an example embodiment. Of course, claimed subject matter is not limited in scope in these respects.

Figure 3:
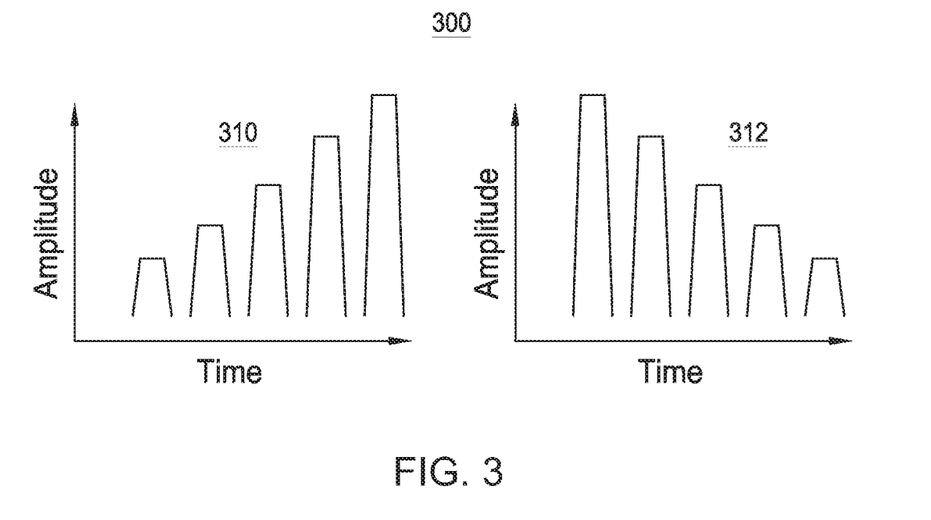
FIG. 3 is an illustration depicting example forward-biased programming voltage and/or current pulse sequences for an example multi-level resistive storage component, according to an embodiment.
Figure 4:
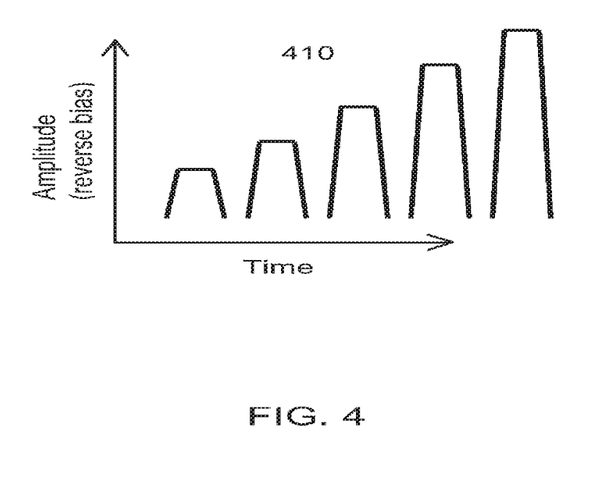
FIG. 4 is an illustration depicting an example reverse-biased programming voltage and/or current pulse sequence for an example multi-level resistive storage component, according to an embodiment.
Figure 5:
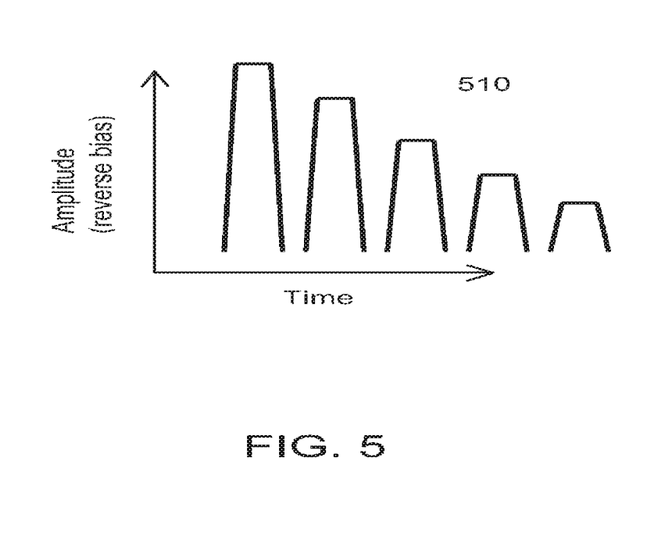
FIG. 5 is an illustration depicting an example reverse-biased programming voltage and/or current pulse sequence for an example multi-level resistive storage component, according to an embodiment.
Figure 6:
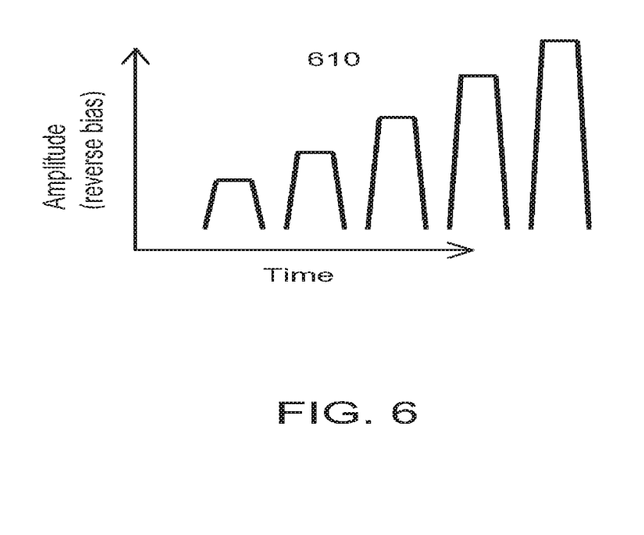
FIG. 6 is an illustration depicting an example reverse-biased programming voltage and/or current pulse sequence for an example multi-level resistive storage component, according to an embodiment.

As further explained below, curve 320 in FIG. 2 is the result of forward bias pulses (FIG. 3). A forward-biased rising staircase 310 (FIG. 3) can transition along curve 320 from set to reset states, whereas a forward-biased falling staircase 312 can transition along curve 320 from reset to set states. All other curves in FIG. 2 are the result of reverse biase pulses (FIGS. 4-6). In particular, curve 420 from set to reset states is the result of the reverse bias pulse sequence 410 (FIG. 4); curve 520 is the result of reverse-biased falling pulse sequence 510 (FIG. 5); and curve 620 is the result of reverse-biased rising pulse sequence 610 (FIG. 6). FIG. 3 is an illustration depicting example forward-biased programming voltage and/or current pulse sequences 300 for an example multi-level resistive storage component, such as storage component 120, according to an embodiment. For the example of FIG. 3, programming pulse sequence 300 may comprise a rising staircase sequence 310 or a falling staircase sequence 312. In an embodiment, a rising staircase programming pulse sequence, such as rising staircase sequence 310, may comprise one or more pulses, wherein subsequent pulses are increased in magnitude over one or more previous pulses. Similarly, in an embodiment, a falling staircase programming pulse sequence, such as falling staircase sequence 312, may comprise one or more pulses, wherein subsequent pulses are decreased in magnitude over one or more previous pulses. It will be understood that fewer or greater numbers of pulses than those illustrated in FIG. 3 can be employed.

In an embodiment, either rising staircase sequence 310 or falling staircase sequence 312 of programming pulse sequence 300 may be applied to a resistive storage component, such as PCM storage component 120 (FIG. 1), with a forward bias. Referring to FIG. 2, example programming pulse sequence 300 may correspond to curve 320, with an assumption that storage component 120 is initially in set state 210. For example, as programming pulses in rising staircase sequence 310 of programming pulse sequence 300 are initially applied with a forward bias to a resistive storage component, such as PCM storage component 120, a corresponding read current may comprise a relatively high current, which for the present example may comprise approximately 0.010 mA ($10^{-5}$ A) for a readout bias of 0.2 V, due at least in part to a relatively low resistance of storage component 120 in set state 210. Of course, claimed subject matter is not limited in scope to the example voltage, current, and/or resistance levels described herein. Rather, embodiments in accordance with claimed subject matter may comprise wide ranges of voltage, current, and/or resistance levels. Additionally, claimed subject matter is not limited in scope to example amounts of programming pulses described herein, or to example sequence patterns of programming pulses.

For example programming sequence 300, as rising staircase sequence 310 continues to be applied to a resistive storage component, such as PCM storage component 120, a transition may occur as programming pulses approach a magnitude of approximately 0.8V. As rising staircase sequence 310 completes as programming pulses reach magnitudes of approximately greater than 1.0V, storage component 120 may enter a reset state, such as reset state 220, as depicted by curve 320, for example.

In an embodiment, in a situation wherein a resistive storage component, such as PCM storage component 120 (FIG. 1), resides in a reset state, such as reset state 220, and wherein a programming operation is specified to program storage component 120 to a set state, such as set state 210, falling staircase sequence 312 may be applied with a forward bias to storage component 120. Referring to FIG. 2, as programming pulses of falling staircase sequence 312 are applied and as the magnitudes of the programming pulses are reduced to a level of approximately 1.0V, a transition may occur within storage component 120, and at 0.8 V storage component 120 may enter a set state, such as set state 210, as magnitudes of programming pulses of falling staircase 312 are reduced to levels below 0.8V, as depicted by curve 320, for example.

For the example depicted by curve 320, a resistive storage component, such as PCM storage component 120, currently residing in a set state, such as set state 210, may be programmed to a reset state, such as reset state 220, by way of an application of one or more forward-biased programming pulse(s), such as rising staircase sequence 310, in an embodiment. Additionally for the example depicted by curve 320, a resistive storage component, such as PCM storage component 120, currently residing in a reset state, such as reset state 220, may be programmed to a set state, such as set state 210, by way of an application of one or more forward-biased programming pulse(s), such as falling staircase sequence 312, in an embodiment. For purposes of illustration, only one curve 320 is illustrated for both RESET (forward-biased rising staircase 310) and SET (forward-biased falling staircase 312); in reality the curves are slightly different but resemble each other closely enough as to be depicted as one curve 320.

FIG. 4 is an illustration depicting an example reverse-biased programming voltage and/or current pulse sequence 410 for an example multi-level resistive storage component, such as storage component 120 (FIG. 1), according to an embodiment. For the example of FIG. 4, programming pulse sequence 410 may comprise a rising staircase programming pulse sequence. Referring to FIG. 2, example programming pulse sequence 410 may correspond to curve 420, with an assumption that storage component 120 is initially in set state 210. For example, as programming pulses in rising staircase programming pulse sequence 410 are initially applied with a reverse bias to a resistive storage component, such as PCM storage component 120, a corresponding read current may comprise a relatively high current, which for the present example may comprise approximately 0.010 mA ($10^{-5}$ A) for a readout bias of 0.2 V, due at least in part to a relatively low resistance of storage component 120 in set state 210. As rising staircase programming pulse sequence 410 continues to be applied with a reverse bias to a resistive storage component, such as PCM storage component 120, a transition may occur as programming pulses approach a magnitude of approximately 1.0V. As rising staircase programming pulse sequence 410 completes as programming pulses reach magnitudes of approximately greater than 1.2V, storage component 120 may enter a reset state, such as reset state 220, as depicted by curve 420, for example.

As depicted by example curve 420, for a reverse-bias rising staircase programming pulse sequence, a transition from a relatively low resistance state, such as set state 210, to a relatively high resistance state, such as reset state 220, may occur at a different voltage level than was the case with the example of the forward-biased rising staircase programming pulse sequence discussed above in connection with FIG. 3 and depicted by example curve 320. Without being limited by theory, different current/voltage behaviors for a storage component depending on whether programming pulses are forward-biased or reverse-biased may be due, at least in part, to electro-migration of atoms of materials comprising the storage component, as discussed above.

FIG. 5 is an illustration depicting an example reverse-biased programming voltage and/or current pulse sequence 510 for an example multi-level resistive storage component, such as storage component 120 (FIG. 1), according to an embodiment. For the example of FIG. 5, programming pulse sequence 510 may comprise a falling staircase programming pulse sequence. Referring to FIG. 2, example programming pulse sequence 510 may correspond to curve 520, with an assumption that storage component 120 is initially in reset state 220. For example, as programming pulses in falling staircase programming pulse sequence 510 are initially applied with a reverse bias to a resistive storage component, such as PCM storage component 120, a corresponding read current may comprise a relatively low current, which for the present example may comprise approximately 0.010 µA ($10^{-8}$ A) for a readout bias of 0.2 V, due at least in part to a relatively high resistance of storage component 120 in reset state 220. As falling staircase programming pulse sequence 510 continues to be applied with a reverse bias to a resistive storage component, such as PCM storage component 120, a transition may occur as programming pulses approach a magnitude of approximately 1.2V. As falling staircase programming pulse sequence 510 completes as programming pulses reach magnitudes of approximately less than 1.0V, storage component 120 may enter an intermediate state, such as intermediate state 230, as depicted by curve 520, for example. In an embodiment, intermediate state 230 corresponds to an intermediate resistance level for storage component 120, wherein an intermediate resistance value is greater than a resistance value for set state 210 and is less than a resistance value for reset state 220.

For the example depicted by curve 520, a resistive storage component, such as PCM storage component 120, currently residing in a reset state, such as reset state 220, may be programmed to an intermediate state, such as intermediate state 230, by way of an application of a reverse-biased falling staircase programming pulse sequence, such as falling staircase programming pulse sequence 510, in an embodiment.

FIG. 6 is an illustration depicting an example reverse-biased programming voltage and/or current pulse sequence 610 for an example multi-level resistive storage component, such as storage component 120, according to an embodiment. For the example of FIG. 6, programming pulse sequence 610 may comprise a rising staircase programming pulse sequence. Referring to FIG. 2, example programming pulse sequence 610 may correspond to curve 620, with an assumption that storage component 120 is initially in intermediate state 230. For example, as programming pulses in rising staircase programming pulse sequence 610 are initially applied with a reverse bias to a resistive storage component, such as PCM storage component 120, a corresponding read current may comprise an intermediate current level, which for the present example may comprise approximately 2-3 µA (2-3×$10^{-6}$ A) for a readout bias of 0.2V, due at least in part to an intermediate resistance level of storage component 120 in intermediate state 230. Of course, as mentioned above, claimed subject matter is not limited in scope to the example voltage, current, and/or resistance levels described herein. Rather, embodiments in accordance with claimed subject matter may comprise wide ranges of voltage, current, and/or resistance levels.

For example programming sequence 610, as rising staircase programming sequence 610 continues to be applied to a resistive storage component, such as PCM storage component 120, a transition may occur as programming pulses approach a magnitude of approximately 1.1V. As rising staircase programming sequence 610 programming pulses reach magnitudes of approximately greater than 1.2V, storage component 120 may enter a reset state, such as reset state 220, as depicted by curve 620, for example. As depicted by curve 620, in a situation wherein a resistive storage component, such as PCM storage component 120, resides in an intermediate state, such as intermediate state 230, and wherein a programming operation is specified to program storage component 120 to a reset state, such as reset state 220, rising staircase programming sequence 610 may be applied with a reverse bias to storage component 120, as mentioned above.

Figure 7A:
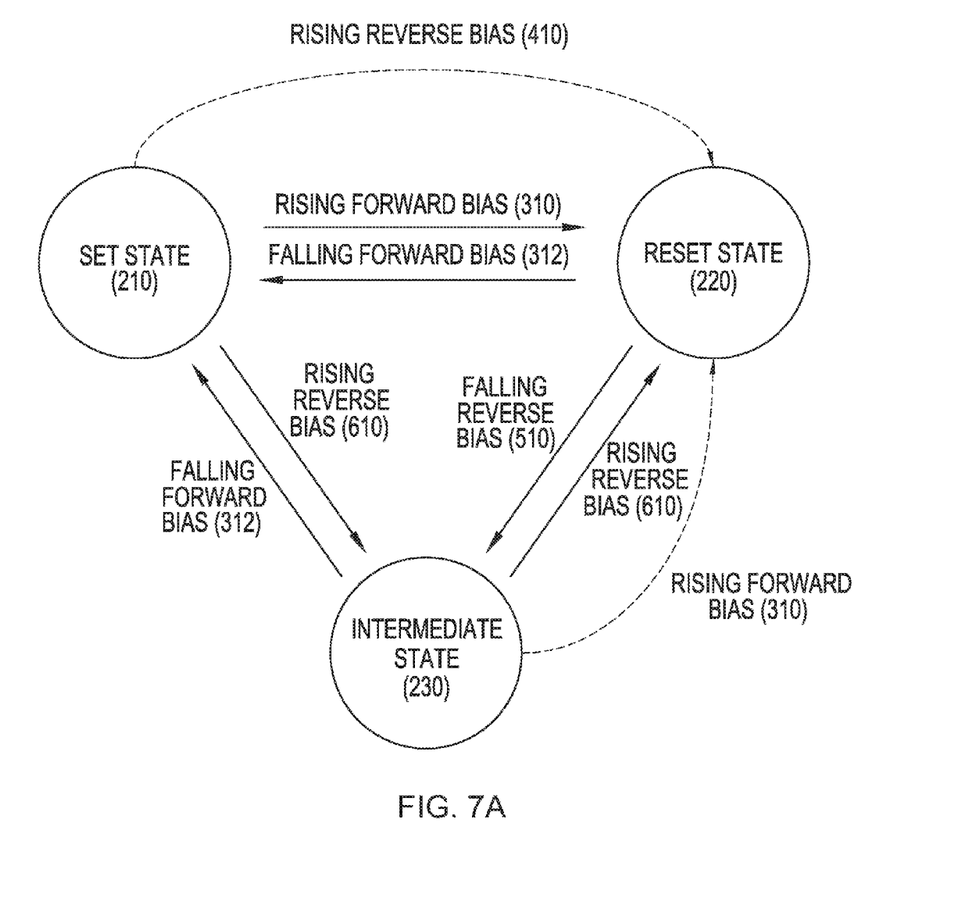
FIG. 7A summarizes different state transitions applying different pulse sequences with either forward or reverse bias.

FIG. 7A summarizes different state transitions applying different pulse sequences with either forward or reverse bias. As can be seen, transition from any of the three illustrated states to any of the other illustrated states can be accomplished by application of one or two sequences of rising forward bias, falling forward bias, rising reverse bias and falling reverse bias. In particular, transitions between reset and intermediate states can be accomplished by falling and rising reverse bias pulses. FIG. 7A also illustrates additional possibilities for transitions from set to reset using rising reverse bias pulse sequences 410, and intermediate to reset using rising forward bias pulse sequences 310.

Figure 7B:
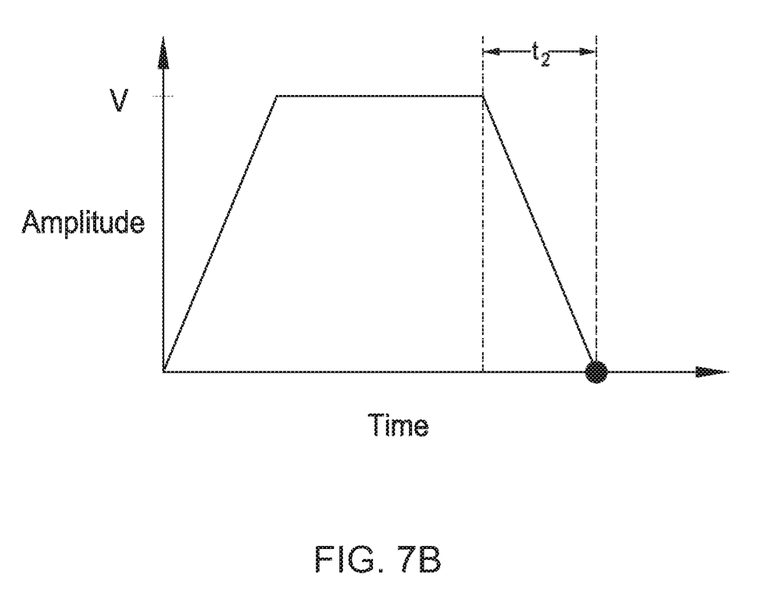
FIG. 7B illustrates an example programming pulse in detail, illustrating a trailing edge slope or fall time that can be modulated.

FIG. 7A also shows, in addition to the transitions described above with respect to FIG. 2, possibilities for direct transitions between set and intermediate states. Such transitions may be managed by selection of forward bias (for intermediate to set transitions) or reverse bias (for set to intermediate transition), along with management of the programming pulses' falling edge slope. FIG. 7B shows, for an example programming pulse, falling time $t_2$ for the trailing edge of a programming pulse, which determines the slope of the pulse falling edge. This trailing edge slope may be modulated for either forward or reverse bias to attain transitions between set and intermediate states.

Figure 8:
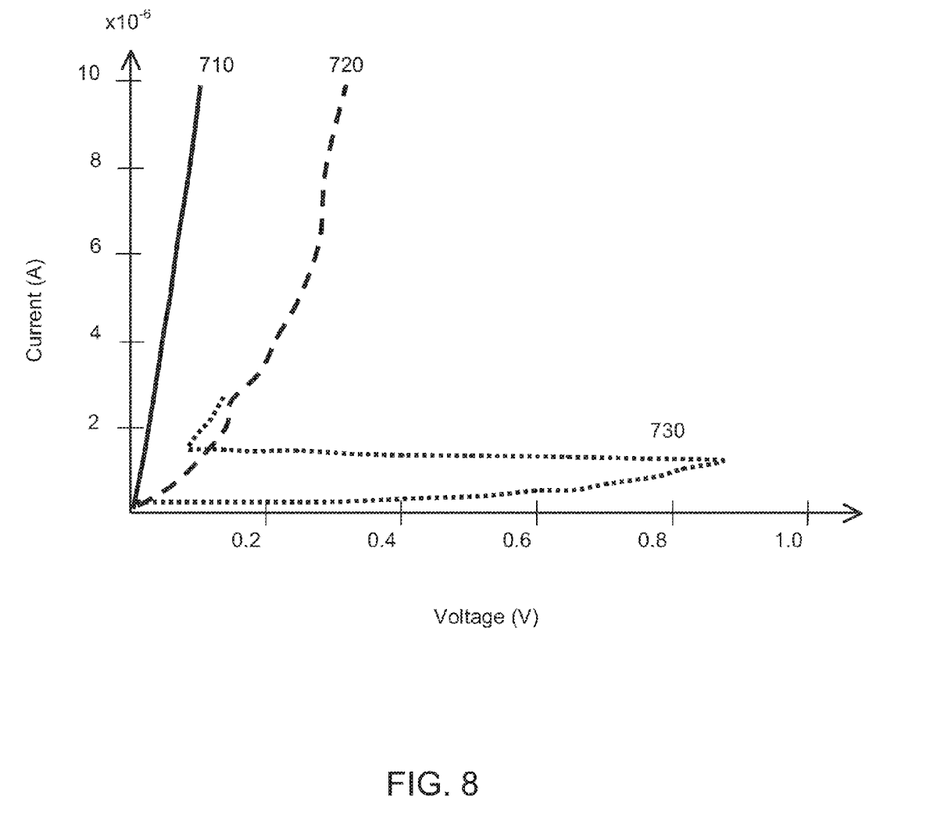
FIG. 8 is an illustration depicting an example read voltage/current chart for an example multi-level memory cell programmed with example programming voltage and/or current pulse sequences, according to an embodiment.

FIG. 8 is an illustration depicting an example read voltage/current chart for an example multi-level memory cell, such as PCM storage component 120, programmed with example programming voltage and/or current pulse sequences, such as example programming pulse sequences 310, 312 410, 510, and/or 610, described above, according to an embodiment. In an embodiment, example programming state 710 may comprise a set state, example programming state 720 may comprise an intermediate state, and example programming state 730 may comprise a reset state. The current-voltage characteristics corresponding to these states 710, 720 and 730 different from one another and may be employed to distinguish states in read operations. For example, applying a readout bias of 0.2 V, the PCM storage component 120 in programming state 730 can result in a relatively low current, such on the order of fractions of a microAmp (µA). The same readout bias can result in an intermediate current when the PCM storage component 120 is in the programming state 720, such as on the order of a few µA. The same readout bias can result in a relatively high current when the PCM storage component 120 is in programming state 710, such as tens of µA. However, as mentioned previously, claimed subject matter is not limited in scope to a single intermediate programming state. Rather, other embodiments may incorporate additional intermediate states.

In an embodiment, any of example programming states 710, 720, or 730 may be achieved in a resistive storage component, such as PCM storage component 120, by application of one or more forward-biased and/or reverse-biased programming pulse(s) or pulse sequences. Additionally, in an embodiment, example programming states 710, 720, or 730 may be achieved in a resistive storage component, such as PCM storage component 120, at least in part by application of one or more rising staircase and/or falling staircase programming pulse sequences that may be applied with a forward bias and/or with a reverse bias, although claimed subject matter is not limited in scope in these respects.

Figure 9:
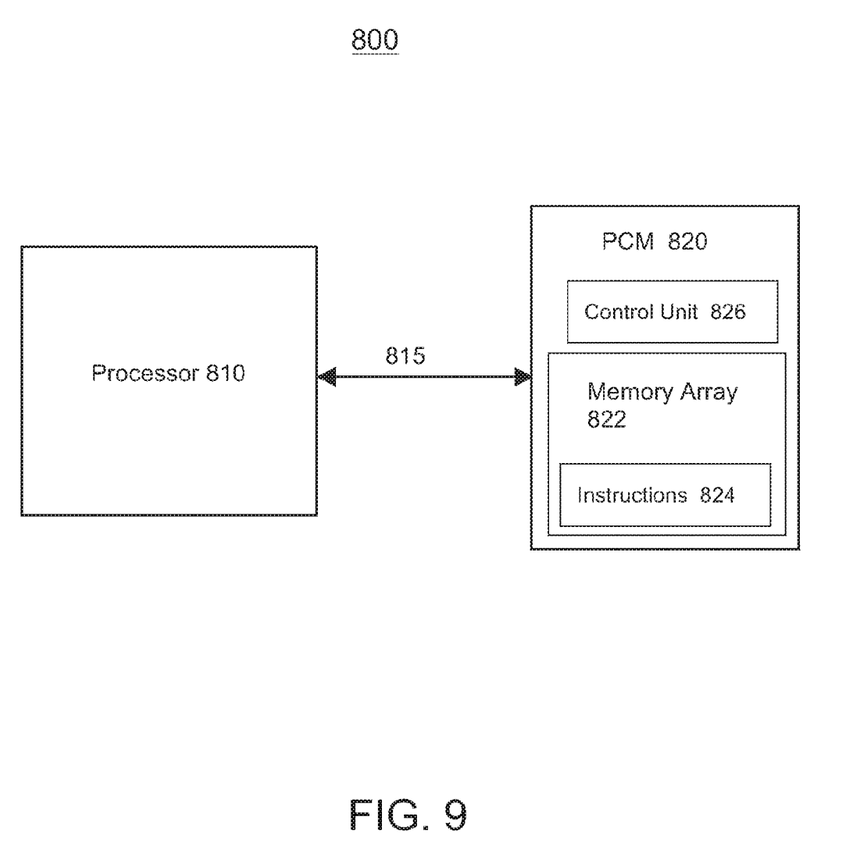
FIG. 9 is a schematic diagram depicting an example computing platform including a phase change memory device, according to an embodiment.

FIG. 9 is a schematic block diagram depicting an example system 800 including an example PCM device 820. In an embodiment, PCM device 820 may comprise a storage area 822 including an array of PCM storage components, such as in accordance with one or more examples. PCM device 820 may, in an example embodiment, be coupled to a processor 810 by way of an interconnect 815. In an embodiment, PCM device 820 may comprise one or more field effect transistors (FETs), such as a metal oxide semiconductor FETs (MOSFETs) as selector components (not shown) for the array of PCM storage components. In an embodiment, FETs as selector components for storage components may allow for forward and reverse bias programming pulses to be applied to the storage components. Accordingly, each memory cell in the array can comprise an FET selector electrically coupled to a storage component, such as the PCM storage component 120 of FIG. 1. For example, the selector can be electrically coupled by way of the bottom electrode 140 of FIG. 1. However, claimed subject matter is not limited in scope in this respect.

PCM device 820 in an embodiment may comprise a control unit 826. Additionally, storage area 822 may store instructions 824 that may include one or more applications that may be executed by processor 810, according with an embodiment. Processor 810 may transmit a memory access command to PCM device 820, for example. Control unit 826 may access one or more memory cells of storage area 822 at least in part in response to receiving the memory access command from processor 810, according to an embodiment. Of course, computing platform 800 is merely one example of a system implemented in accordance with claimed subject matter, and the scope of claimed subject matter is not limited in these respects.

The term "computing platform" as used herein refers to a system and/or a device that includes the ability to process and/or store data in the form of signals and/or states. Thus, a computing platform, in this context, may comprise hardware, software, firmware or any combination thereof (other than software per se). Computing platform 800, as depicted in FIG. 8, is merely one such example, and the scope of claimed subject matter is not limited to this particular example. For one or more embodiments, a computing platform may comprise any of a wide range of digital electronic devices, including, but not limited to, personal desktop or notebook computers, tablet devices, high-definition televisions, digital versatile disc (DVD) players and/or recorders, game consoles, satellite television receivers, cellular telephones, personal digital assistants, mobile audio and/or video playback and/or recording devices, or any combination of the above.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, and/or characteristic in the singular and/or may be used to describe a plurality or some other combination of features, structures and/or characteristics. Though, it should be noted that this is merely an illustrative example and claimed subject matter is not limited to this example.

Methodologies described herein may be implemented by various techniques depending, at least in part, on applications according to particular features and/or examples. For example, methodologies may be implemented in hardware, firmware, or combinations thereof, along with software (other than software per se). In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other device units designed to perform function described herein, or combinations thereof.

In the preceding detailed description, numerous specific details have been set forth to provide a thorough understanding of claimed subject matter. However, it will be understood by those skilled in the art that claimed subject matter may be practiced without these specific details. In other instances, methods and/or apparatuses that would be known by one of ordinary skill have not been described in detail so as not to obscure claimed subject matter.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation and/or a physical change or transformation in molecular structure, such as from crystalline to amorphous or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state form a binary one to a binary zero or vice-versa in a memory device may comprise a transformation, such as a physical transformation. Rather, the foregoing is intended as illustrative examples.

While there has been illustrated and/or described what are presently considered to be example features, it will be understood by those skilled in the art that various other modifications may be made and/or equivalents may be substituted, without departing from claimed subject matter. Additionally, many modifications may be made to adapt a particular situation to the teachings of claimed subject matter without departing from the central concept(s) described herein.

Therefore, it is intended that claimed subject matter not be limited to the particular examples disclosed, but that such claimed subject matter may also include all aspects falling within the scope of appended claims and/or equivalents thereof.

What is claimed is:

1. A method of programming a memory device, comprising:
applying one or more forward-biased electrical pulses to a memory cell; and
programming the memory cell from an intermediate programming state to a set programming state based at least in part on applying the one or more forward-biased electrical pulses, wherein the one or more forward-biased electrical pulses ramp in a first sequence.

2. The method of claim 1, further comprising:
applying one or more reverse-biased electrical pulses to the memory cell; and
programming the memory cell from the set programming state to the intermediate programming state based at least in part on applying the one or more reverse-biased electrical pulses, wherein the one or more reverse-biased electrical pulses ramp in a second sequence different from the first sequence.

3. The method of claim 2, wherein the first sequence comprises a falling staircase sequence, wherein the second sequence comprises a rising staircase sequence, and wherein the one or more forward-biased electrical pulses, the one or more reverse-biased electrical pulses, or both ramp sequentially.

4. The method of claim 2, further comprising:
modulating a trailing edge of at least some of the one or more reverse-biased electrical pulses,
wherein programming the memory cell from the set programming state to the intermediate programming state is based at least in part on the modulating.

5. The method of claim 1, further comprising:
modulating a trailing edge of at least some of the one or more forward-biased electrical pulses,
wherein programming the memory cell from the intermediate programming state to the set programming state is based at least in part on the modulating.

6. The method of claim 1, further comprising:
applying one or more reverse-biased electrical pulses to the memory cell; and
programming the memory cell from the set programming state to a reset programming state based at least in part on applying the one or more reverse-biased electrical pulses, wherein the one or more reverse-biased electrical pulses sequentially ramp in a rising staircase sequence.

7. The method of claim 6, further comprising:
programming the memory cell from the reset programming state to the set programming state based at least in part on applying the one or more forward-biased electrical pulses, wherein the one or more forward-biased electrical pulses sequentially ramp in a falling staircase sequence.

8. The method of claim 7, wherein the memory cell comprises a phase change material, wherein the set programming state comprises a crystalline state having a first threshold voltage characteristic, and wherein the reset programming state comprises an amorphous state having a second threshold voltage characteristic.

9. The method of claim 1, further comprising:
programming the memory cell from the set programming state to a reset programming state based at least in part on applying the one or more forward-biased electrical pulses, wherein the one or more forward-biased electrical pulses sequentially ramp in a rising staircase sequence.

10. The method of claim 1, wherein applying the one or more forward-biased electrical pulses comprises:
applying a voltage across a storage component such that a current flows from a top electrode to a bottom electrode of the storage component.

11. A memory device, comprising:
a memory array comprising a plurality of memory cells; and
a control unit configured to program one or more memory cells of the plurality of memory cells from an intermediate programming state to a set programming state based at least in part on applying one or more forward-biased electrical pulses that ramp in a first sequence to the one or more memory cells.

12. The memory device of claim 11, the control unit configured to:
program the one or more memory cells from the set programming state to the intermediate programming state based at least in part on applying one or more reverse-biased electrical pulses that sequentially ramp in a second sequence to the one or more memory cells.

13. The memory device of claim 11, the control unit configured to:
program the one or more memory cells from the set programming state to a reset programming state based at least in part on applying one or more reverse-biased electrical pulses that ramp in a second sequence to the one or more memory cells.

14. The memory device of claim 13, wherein the first sequence comprises a decreasing sequence and the second sequence comprises an increasing sequence, and wherein the one or more forward-biased electrical pulses and the one or more reverse-biased electrical pulses ramp sequentially.

15. The memory device of claim 11, the control unit configured to:
program the one or more memory cells from the set programming state to a reset programming state based at least in part on applying the one or more forward-biased electrical pulses that sequentially ramp in an increasing sequence to the one or more memory cells.

16. The memory device of claim 15, wherein the one or more memory cells comprise a phase change material, wherein the set programming state comprises a crystalline state having a first threshold voltage characteristic, and wherein the reset programming state comprises an amorphous state having a second threshold voltage characteristic.

17. A system, comprising:
a processor; and
a memory device comprising a plurality of memory cells, the memory device communicatively coupled to the processor and configured to:
program one or more memory cells of the plurality of memory cells from an intermediate programming state to a set programming state based at least in part on applying one or more forward-biased electrical pulses that ramp in a first sequence to the one or more memory cells.

18. The system of claim 17, the memory device configured to:
    program the one or more memory cells to the intermediate programming state, a reset programming state, or both based at least in part on applying one or more reverse-biased electrical pulses to the one or more memory cells.

19. The system of claim 18, wherein the one or more reverse-biased electrical pulses ramp in the first sequence, and wherein the one or more forward-biased electrical pulses ramp in a second sequence different from the first sequence.

20. The system of claim 19, wherein the one or more memory cells comprise a phase change material, wherein the set programming state comprises a crystalline state having a first threshold voltage characteristic, and wherein the reset programming state comprises an amorphous state having a second threshold voltage characteristic.

\* \* \* \* \*